(12) United States Patent
Bernardon

(10) Patent No.: US 11,777,497 B1
(45) Date of Patent: Oct. 3, 2023

(54) EFFICIENCY CONCEPT FOR DRIVING A PMOS AND NMOS FULL-BRIDGE POWER STAGE

(71) Applicant: Infineon Technologies Austria AG, Villach (AT)

(72) Inventor: Derek Bernardon, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/707,365

(22) Filed: Mar. 29, 2022

(51) Int. Cl.
*H02M 1/08* (2006.01)
*H03K 17/687* (2006.01)
*H02P 7/03* (2016.01)

(52) U.S. Cl.
CPC .......... *H03K 17/6872* (2013.01); *H02M 1/08* (2013.01); *H02P 7/04* (2016.02)

(58) Field of Classification Search
CPC .............................. H02M 1/08; H03K 17/6872
USPC ........................ 327/108, 109, 110, 111, 576
See application file for complete search history.

(56) References Cited

U.S. PATENT DOCUMENTS

| | | | |
|---|---|---|---|
| 8,278,886 B2* | 10/2012 | Megaw ............. | H03K 17/6871 323/273 |
| 10,972,095 B2 | 4/2021 | Kong et al. | |
| 2018/0013422 A1* | 1/2018 | Leong ................... | H02M 3/156 |
| 2020/0287534 A1* | 9/2020 | Dietrich .............. | H03K 17/687 |

FOREIGN PATENT DOCUMENTS

JP   H053626 A   1/1993

* cited by examiner

*Primary Examiner* — William Hernandez
(74) *Attorney, Agent, or Firm* — Murphy, Bilak & Homiller, PLLC

(57) ABSTRACT

A circuit, which might be a full-bridge driver circuit, comprises a first PMOS high-side transistor device and a first NMOS low-side transistor device. The circuit further comprises turn-on circuitry configured to turn on the first PMOS high-side transistor device while simultaneously turning on the first NMOS low-side transistor device, by routing charge stored in a gate of the first PMOS high-side transistor device to a gate of the first NMOS low-side transistor device, to charge the gate of the first NMOS low-side transistor device.

8 Claims, 3 Drawing Sheets

EFFICIENCY CONCEPT FOR DRIVING A PMOS AND NMOS FULL-BRIDGE POWER STAGE

TECHNICAL FIELD

The present disclosure is generally related to transistor circuits and is more particularly related to full-bridge transistor power stages.

BACKGROUND

Today, many electronic circuits, such as motor drivers and power converters, use a full-bridge topology, also referred to as an "H-bridge" topology, with PMOS and NMOS power devices. Sometimes these power devices are integrated, and sometimes not.

Power losses in such circuits include the power losses due to the gate losses of the PMOS and NMOS power devices. This gate loss can be calculated as:

$$Pgateloss = f * 0.5 * Cgate * VgsON,$$

where f is the switching frequency, Cgate is the gate capacitance, and VgsON is the gate voltage when the device is turned on.

Often the power losses due to the gate losses in full-bridge circuits can affect the system efficiency quite significantly. There are two specific cases where this occurs: at high frequency, and for large power devices. Since the design demands on systems today have the tendency to increase both switching frequency and output power capabilities, the gate losses are becoming more and more significant.

SUMMARY

Various embodiments of the circuits and techniques described herein address this problem by using the charge stored in the gate of the full bridge's PMOS high-side power device, which is typically much larger than the low-side NMOS power device and thus has a significantly higher gate capacitance and stored charge. Instead of simply dumping this charge into the ground when the PMOS device is turned on, this charge is used to turn on a corresponding low-side NMOS device, with the excess charge being used to provide current for other uses in the circuit.

An example circuit comprises a first PMOS high-side transistor device and a first NMOS low-side transistor device. These devices may be part of a full-bridge (H-bridge) driver circuit in which the first PMOS high-side transistor device is connected between an input supply voltage and a first terminal of a load and the first NMOS low-side transistor device is connected between a second terminal of the load and ground. The example circuit further comprises turn-on circuitry configured to turn on the first PMOS high-side transistor device while simultaneously turning on the first NMOS low-side transistor device, by routing charge stored in a gate of the first PMOS high-side transistor device to a gate of the first NMOS low-side transistor device, to charge the gate of the first NMOS low-side transistor device.

In some embodiments of this example circuit, the first PMOS high-side transistor device has a gate capacitance higher than a gate capacitance of the first NMOS low-side transistor device, and the circuit further comprises a capacitor coupled to the turn-on circuitry and configured to receive an excess of charge stored in the gate of the first PMOS high-side transistor device over that used to charge the gate of the first NMOS low-side transistor device, each time the first PMOS high-side transistor device and first NMOS low-side transistor device are turned on. This capacitor may, in some embodiments, be configured to supply current to a different load from that of the full-bridge driver circuit.

In some embodiments of the example circuit, the turn-on circuitry comprises a PMOS switching transistor coupled to the gate of the first PMOS high-side transistor device and an NMOS switching transistor coupled between the gate of the first NMOS low-side transistor device and the PMOS switching transistor, as well as an arrangement of additional switching transistors configured to turn on the first PMOS high-side transistor device and NMOS low-side transistor device by lowering a gate voltage of the PMOS switching transistor to a DC voltage in between the high-side and low-side voltages while raising a gate voltage of the NMOS switching transistor to the DC voltage, so that both the PMOS switching transistor and the NMOS switching transistor are conducting charge from the gate of the first PMOS high-side transistor device to the gate of the first NMOS low-side transistor device.

DETAILED DESCRIPTION

Examples of the inventive techniques and circuits will be described in detail below, with reference to the attached figures.

In the description that follows, the terminology "connected to" or "connected between" generally means that one node is electrically connected to another, where this connection is via a low-resistance connection unless the context clearly indicates otherwise. The terminology "coupled to," as used herein, means that one node of a circuit is connected to another, either directly (through a low-resistance connection) or through an intervening component, in such a way that current flows, at least some of the time, from one node to the other. Thus, one node might be coupled to another through a switching transistor, a diode, or a resistor, in various examples.

Figure 1:
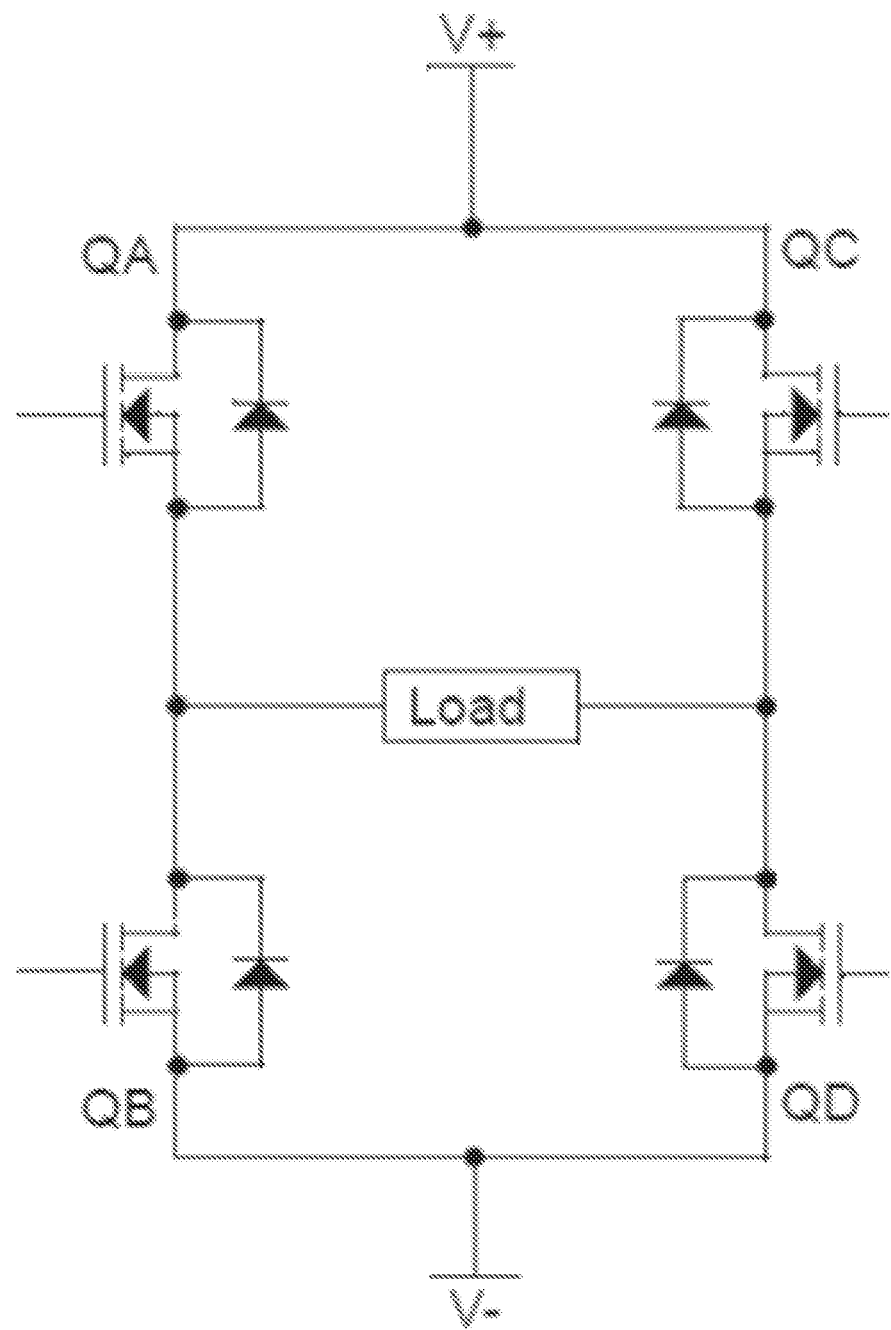
FIG. 1 illustrates an example full-bridge circuit.

FIG. 1 illustrates an example full-bridge circuit, commonly referred to as an "H-bridge." The circuit comprises four transistors, QA, QB, QC, and QD, arranged in an "H" configuration, with a load connected at the cross-bar of the "H." The load may be a DC motor, for example, or an isolation transformer forming part of a power converter, for example. The operation of the full-bridge driver is well known, and gate driver circuits for controlling the operation of the full-bridge driver are well known and are commercially available as integrated circuits.

In high-power applications in particular, a typical full-bridge circuit like that shown in FIG. 1 might employ PMOS transistors on the "high side" of the full-bridge circuit, i.e., for transistors QA and QC, and NMOS transistors on the "low side." The terms "high side" and "low side" simply refer to whether the transistors at issue are connected to the higher or lower voltage end of the circuit's supply voltage. In the example illustrated in FIG. 1, the high-side transistors QA and QC are connected between the high-side voltage V+ and the load, while the low-side transistors QB and QD are connected between the load and the low-side voltage V−. Note that either V+ or V− might be ground, in some applications.

During operation of the full-bridge circuit, high-side transistor QA and low-side transistor QD are turned on at the same time, while transistors QC and QB are switched off, so that current flows through the load in a first direction, left to right in FIG. 1. Alternately, high-side transistor QC and QB are turned on at the same time, so that current flows through the load in the opposite direction, i.e., right to left in FIG. 1. Gate control circuitry connected to the gates of transistors GA, QB, QC, QD controls the timing of alternatively turning on and off these pairs of transistors, and is typically designed to provide for guard intervals between turning off one pair and turning on the other, so that, for example, transistors QA and QB are never turned on at the same time and transistors QC and QD are never turned on at the same time.

When operated as switches, as they are in the full-bridge circuits discussed herein, an NMOS enhancement mode transistor is turned "on" by raising the gate-to-source voltage VGS of the transistor above a threshold voltage level, while a PMOS transistors are turned "on" by lowering the gate-to-source voltage VGS of the transistor below a threshold voltage level. Thus, in a configuration where the high-side transistors are PMOS devices and the low-side transistors are NMOS devices, this means that turning on the low-side NMOS transistor QD involves charging the intrinsic gate capacitance of the NMOS transistor QD, while simultaneously turning on high-side PMOS transistor QA involves discharging the intrinsic gate capacitance of PMOS transistor QA. The same is true when alternately turning on high-side PMOS transistor QC and low-side NMOS transistor QB.

As briefly noted above, this charging and discharging of the gate capacitances during operation of the full-bridge circuit causes power losses that increase with both the switching frequency and the intrinsic gate capacitances of the devices. In high-frequency power applications, these power losses can be significant.

Embodiments of the present invention address this problem by recouping at least some of these power losses. This is done by taking advantage of the fact that the charge discharged from the gate capacitance of the high-side PMOS device when turning that device on is at least as high, and often several times as high, as the charge that flows into the gate capacitance of the low-side NMOS device when that device is simultaneously turned on. This is because the high-side PMOS devices are often two to three times the size of the low-side NMOS devices. In a conventional circuit, the discharge current from the high-side PMOS gate is simply routed to ground (or to the low-side voltage rail). In the circuits described herein, a portion of this discharge current is instead routed into the gate of the corresponding low-side NMOS gate. Charge in excess of what is needed to fully turn on the low-side NMOS transistor may be dumped to the low-side voltage rail or, in some embodiments, used to supply some other relatively small load, thereby increasing efficiency of the circuit even further.

Figure 2:
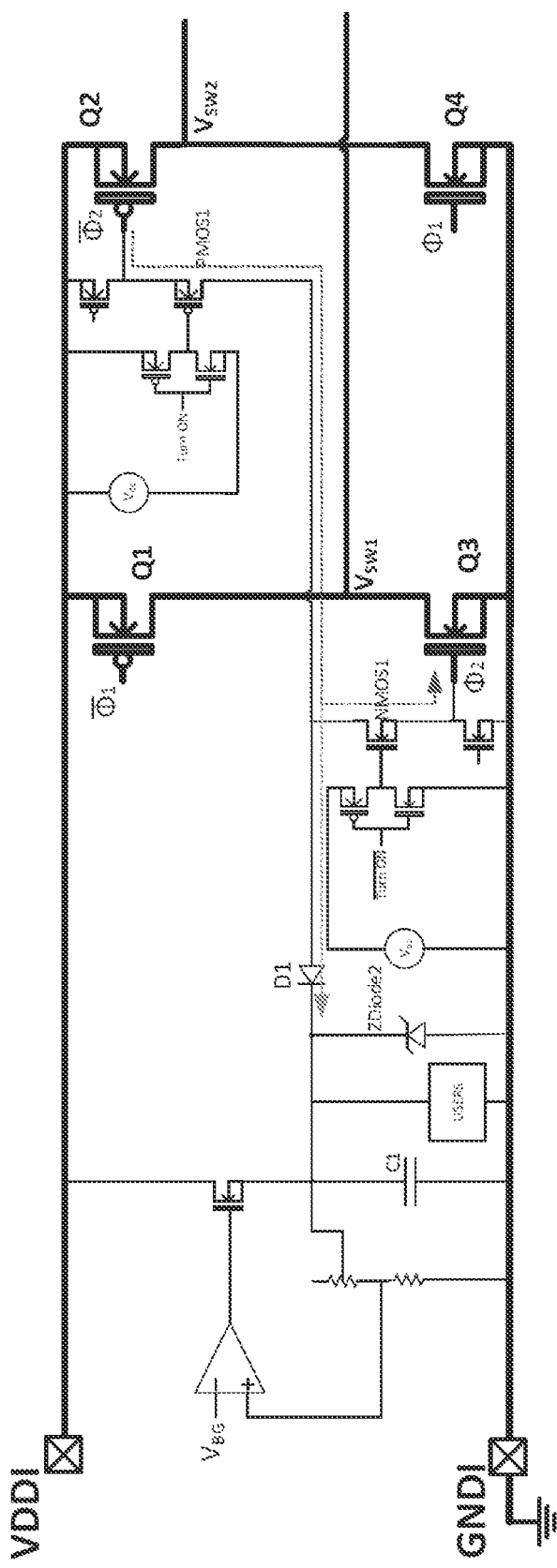
FIG. 2 illustrates an example full-bridge circuit including turn-on circuitry, according to some embodiments.

FIG. 2 illustrates a full-bridge driver circuit that employs this technique. Here, the full-bridge circuit comprises high-side PMOS transistors Q1 and Q2, and low-side NMOS transistors Q3 and Q4. PMOS transistor Q1 and NMOS transistor Q4 are driven with complementary voltages Φ1 and $\overline{Φ1}$, while PMOS transistor Q2 and NMOS transistor are alternately driven with complementary voltages Φ2 and $\overline{Φ2}$. Output nodes Vsw1 and Vsw2 are connected to the load, which is not shown, and thus transistors Q1-Q4 form the full bridge, or H-bridge. Because transistors Q1 and Q4 are driven by voltages Φ1 and $\overline{Φ1}$, they can be referred to as "the Φ1 switches"; likewise, transistors Q2 and Q3 can be referred to as "the Φ2 switches."

The circuit of FIG. 2 further includes turn-on circuitry that includes switching transistors PMOS1 and NMOS1, which are coupled between the gate of high-side PMOS transistor Q3 and the gate of low-side NMOS transistor Q2, i.e., between the gates of the Φ2 switches. While not shown in FIG. 2, it can be imagined that similar circuitry is connected to the Φ1 switches.

When the Φ2 switches are turned on during operation of the full bridge, then the gate of switching transistor PMOS1 will be lowered to a voltage that is lower than the supply voltage VDDI by the voltage of supply Vdc. The source of switching transistor PMOS1 will remove charge from the gate of high-side PMOS transistor Q3 until the gate of high-side PMOS transistor is discharged to a voltage Vdc-Vgs_threshold. At the same time, the gate of switching transistor NMOS1 is raised to Vdc, and this transistor will use the charge flowing from the gate of high-side PMOS transistor Q3 to charge the gate of low-side NMOS transistor Q2. Thus, this quantity of charge is saved, by being routed into the gate of transistor Q2 rather than being dumped to ground.

However, the gate of high-side PMOS transistor Q3 is typically larger than the gate of low-side NMOS transistor Q2, which means that more charge is pulled from the gate of transistor Q3 than is necessary to charge the gate of transistor Q2. With the circuit arrangement shown in FIG. 2, this excess charge will flow through diode D1 into capacitor C1, and can be used to drive one or more loads shown in FIG. 2 as "Users." Excess charge beyond that needed to supply the "users" load is injected into the Zener diode D2. This arrangement further increases the efficiency of the driver circuit.

While not shown in FIG. 2, it will be appreciated that similar turn-on circuitry can be connected to the Φ1 switches. Excess charge pulled from the gate of transistor Q1 beyond that needed to charge the gate of transistor Q4 can similarly be routed to capacitor C1 and load "users," through another diode.

In view of the detailed explanation of FIG. 2 provided above, it will be appreciated that circuits employing the techniques described herein may include a first PMOS high-side transistor device and a first NMOS low-side transistor device, as well as turn-on circuitry configured to turn on the first PMOS high-side transistor device while simultaneously turning on the first NMOS low-side transistor device. The turn-on circuitry is configured so that it turns on the first PMOS high-side transistor device and first NMOS low-side transistor device by routing charge stored in a gate of the first PMOS high-side transistor device to a gate of the first NMOS low-side transistor device, to charge the gate of the first NMOS low-side transistor device.

In some embodiments, the gate of the first PMOS high-side transistor device has a gate capacitance higher than a gate capacitance of the first NMOS low-side transistor device, and the circuit further comprises a capacitor coupled to the turn-on circuitry and configured to receive an excess of charge stored in the gate of the first PMOS high-side transistor device over that used to charge the gate of the first NMOS low-side transistor device, each time the first PMOS high-side transistor device and first NMOS low-side transistor device are turned on. This coupling may be achieved via a diode, e.g., as shown as diode D1 in FIG. 2. This circuit may be further configured to supply power to a load from the capacitor, in some embodiments.

In some embodiments, the turn-on circuitry comprises a PMOS switching transistor coupled to the gate of the first PMOS high-side transistor device, and an NMOS switching transistor coupled between the gate of the first NMOS low-side transistor device and the PMOS switching transistor. The turn-on circuitry in these embodiments may further comprise an arrangement of additional switching transistors configured to turn on the first PMOS high-side transistor device and NMOS low-side transistor device by lowering a gate voltage of the PMOS switching transistor to a DC voltage in between the high-side and low-side voltages while raising a gate voltage of the NMOS switching transistor to the DC voltage, so that both the PMOS switching transistor and NMOS switching transistor are conducting charge from the gate of the first PMOS high-side transistor device to the gate of the first NMOS low-side transistor device.

The arrangement described immediately above may correspond to one high-side and low-side pair of transistors in a full-bridge configuration circuit, in some embodiments. Thus, the circuit described above may, in some embodiments, comprise a second PMOS high-side transistor device and a second NMOS low-side transistor device arranged so that the first PMOS high-side transistor device and second NMOS low-side transistor are operated complementarily to the first PMOS high-side transistor device and first NMOS low-side transistor. In these embodiments, the circuit may further comprise additional turn-on circuitry configured to turn on the second PMOS high-side transistor device while simultaneously turning on the first NMOS low-side transistor device by routing charge stored in a gate of the second PMOS high-side transistor device to a gate of the second NMOS low-side transistor device, to charge the gate of the first NMOS low-side transistor device. The details of this additional turn-on circuitry may correspond to those of the turn-on circuitry described above, in some embodiments.

Figure 3:
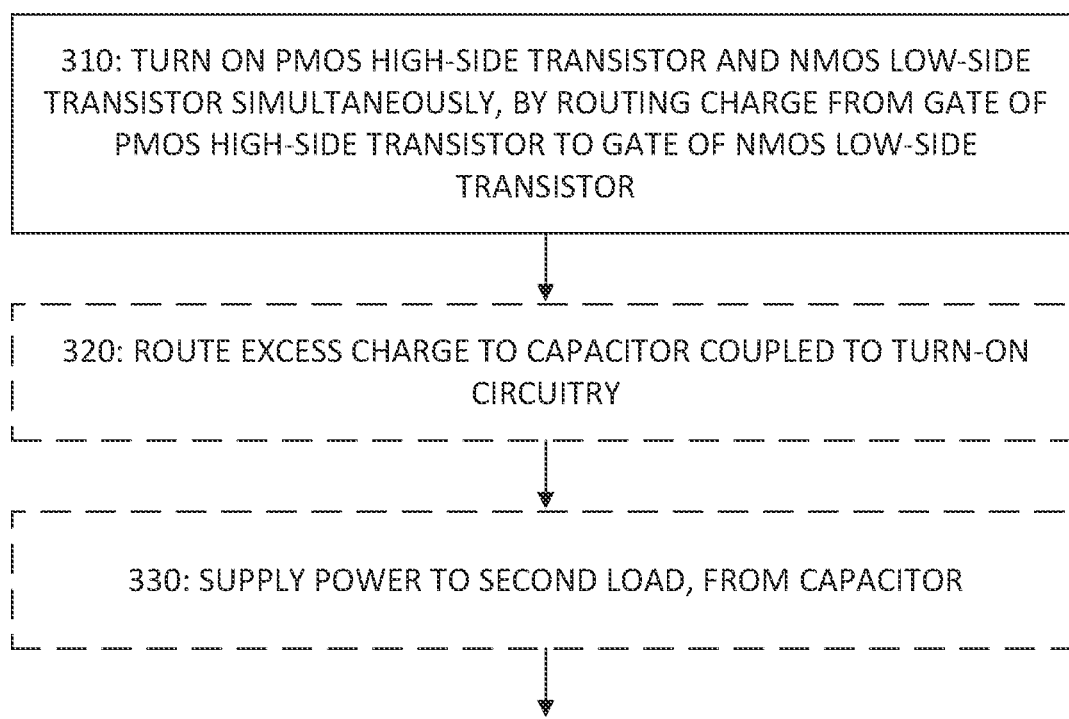
FIG. 3 is a process flow diagram illustrating an example method, according to some embodiments.

The techniques described herein may also be contemplated in terms of a method for operating a circuit that comprises a first PMOS high-side transistor device and a first NMOS low-side transistor device, where the first PMOS-high side transistor device is connected between a high-side voltage and a first node of a load and the first NMOS low-side transistor device is connected between a second node of the load and a low-side voltage. A process flow diagram corresponding to such a method is illustrated in FIG. 3.

As shown at block 310, the method comprises the step of turning on the first PMOS high-side transistor device while simultaneously turning on the first NMOS low-side transistor device, by routing charge stored in a gate of the first PMOS high-side transistor device to a gate of the first NMOS low-side transistor device, to charge the gate of the first NMOS low-side transistor device. In some embodiments, the gate of the first PMOS high-side transistor device has a gate capacitance higher than a gate capacitance of the first NMOS low-side transistor device, and the method further comprises routing an excess of charge stored in the gate of the first PMOS high-side transistor device over that used to charge the gate of the first NMOS low-side transistor device into a capacitor coupled to turn-on circuitry, each time the first PMOS high-side transistor device and first NMOS low-side transistor device are turned on. This is shown at block 320. The method may further comprise supplying power to a second load from the capacitor, as shown at block 330.

The techniques and circuits described herein may be employed to improve the efficiency of various circuits, including, but not limited to, circuits employing power transistors arranged in a full-bridge configuration, such as for driving a motor or power converter. The particular examples described in detail should be understood as illustrative of the inventive concepts described herein, but not limiting.

What is claimed is:

1. A circuit, comprising:
a first PMOS high-side transistor device;
a first NMOS low-side transistor device; and
turn-on circuitry configured to turn on the first PMOS high-side transistor device while simultaneously turning on the first NMOS low-side transistor device, by routing charge stored in a gate of the first PMOS high-side transistor device to a gate of the first NMOS low-side transistor device, to charge the gate of the first NMOS low-side transistor device.

2. The circuit of claim 1, wherein the gate of the first PMOS high-side transistor device has a gate capacitance higher than a gate capacitance of the first NMOS low-side transistor device, and wherein the circuit further comprises a capacitor coupled to the turn-on circuitry and configured to receive an excess of charge stored in the gate of the first PMOS high-side transistor device over that used to charge the gate of the first NMOS low-side transistor device, each time the first PMOS high-side transistor device and first NMOS low-side transistor device are turned on.

3. The circuit of claim 2, wherein the circuit is further configured to supply power to a load from the capacitor.

4. The circuit of claim 1, wherein the turn-on circuitry comprises:
a PMOS switching transistor coupled to the gate of the first PMOS high-side transistor device;
an NMOS switching transistor coupled between the gate of the first NMOS low-side transistor device and the PMOS switching transistor; and
an arrangement of additional switching transistors configured to turn on the first PMOS high-side transistor device and NMOS low-side transistor device by lowering a gate voltage of the PMOS switching transistor to a DC voltage in between a high-side voltage applied to the first PMOS high-side transistor device and a low-side voltage applied to the first NMOS low-side transistor device, while raising a gate voltage of the NMOS switching transistor to the DC voltage, so that both the PMOS switching transistor and NMOS switching transistor are conducting charge from the gate of the first PMOS high-side transistor device to the gate of the first NMOS low-side transistor device.

5. The circuit of claim 1 wherein the circuit is a full-bridge circuit comprising a second PMOS high-side transistor device and a second NMOS low-side transistor device arranged so that the second PMOS high-side transistor device and second NMOS low-side transistor are operated complementarily to the first PMOS high-side transistor device and first NMOS low-side transistor, and further comprising additional turn-on circuitry configured to turn on the second PMOS high-side transistor device while simultaneously turning on the first NMOS low-side transistor device by routing charge stored in a gate of the second PMOS high-side transistor device to a gate of the second NMOS low-side transistor device, to charge the gate of the first NMOS low-side transistor device.

6. A method for operating a circuit comprising a PMOS high-side transistor device and a NMOS low-side transistor device, wherein the PMOS-high side transistor device is connected between a high-side voltage and a first node of a load and the NMOS low-side transistor device is connected between a second node of the load and a low-side voltage, the method comprising:

turning on the PMOS high-side transistor device while simultaneously turning on the NMOS low-side transistor device, by routing charge stored in a gate of the first PMOS high-side transistor device to a gate of the NMOS low-side transistor device, to charge the gate of the NMOS low-side transistor device.

7. The method of claim 6, wherein the gate of the PMOS high-side transistor device has a gate capacitance higher than a gate capacitance of the NMOS low-side transistor device, and wherein the method further comprises routing an excess of charge stored in the gate of the PMOS high-side transistor device over that used to charge the gate of the NMOS low-side transistor device into a capacitor coupled to turn-on circuitry, each time the PMOS high-side transistor device and NMOS low-side transistor device are turned on.

8. The method of claim 7, wherein the method further comprises supplying power to a second load from the capacitor.

\* \* \* \* \*